United States Patent
Linder et al.

(10) Patent No.: US 6,535,062 B1
(45) Date of Patent: Mar. 18, 2003

(54) LOW NOISE, LOW DISTORTION, COMPLEMENTARY IF AMPLIFIER

(75) Inventors: Lloyd F. Linder, Agoura Hills; Thomas E. Frost, Torrance, both of CA (US)

(73) Assignee: Raytheon Company, Lexington, MA (US)

( * ) Notice: Subject to any disclaimer, the term of this patent is extended or adjusted under 35 U.S.C. 154(b) by 140 days.

(21) Appl. No.: 09/607,223

(22) Filed: Jun. 30, 2000

(51) Int. Cl.$^7$ ............................................... H03F 3/45
(52) U.S. Cl. ......................................... 330/255; 330/263
(58) Field of Search ................................. 330/252, 255, 330/263

(56) References Cited

U.S. PATENT DOCUMENTS

| | | | | |
|---|---|---|---|---|
| 4,912,425 A | * | 3/1990 | Kobayashi et al. | 330/255 |
| 5,374,897 A | * | 12/1994 | Maraueji | |
| 5,606,287 A | * | 2/1997 | Kobayashi et al. | 330/255 |
| 5,786,731 A | * | 7/1998 | Bales | |
| 6,069,523 A | * | 5/2000 | Brown | |
| 6,262,633 B1 | * | 7/2001 | Close | 330/267 |

OTHER PUBLICATIONS

Analog Devices Product Specification Sheet for "Low Distortion 1.0 GHz Differential Amplifier" (AD–3650).

* cited by examiner

Primary Examiner—Michael B Shingleton
(74) Attorney, Agent, or Firm—Leonard A. Alkov; Glenn H. Lenzen, Jr.

(57) ABSTRACT

Arrangements of Class AB (push-pull) amplifiers, one in a higher voltage configuration and one in a lower voltage configuration, to achieve a high intercept at low power as well as a low noise figure in a complementary technology allowing for higher performance at lower power. In an illustrative embodiment, the invention includes a first circuit for receiving an input signal; a second circuit for shifting a level of the input signal; and a third circuit for amplifying the input signal. In the illustrative embodiment, the third circuit includes first and second transistors Q3 and Q4 connected in a push-pull configuration. In the illustrative embodiment, the first and second transistors Q3 and Q4 are connected to form Class AB amplifiers and the first transistor Q3 is of a first type and the second transistor Q4 is of a second type. The teachings of the present invention are illustrated in a differential amplifier.

10 Claims, 2 Drawing Sheets

LOW NOISE, LOW DISTORTION, COMPLEMENTARY IF AMPLIFIER

BACKGROUND OF THE INVENTION

1. Field of the Invention

The present invention relates to electronic circuits and systems. More specifically, the present invention relates to intermediate frequency amplifiers used in communications receivers.

2. Description of the Related Art

Power consumption is a critical consideration in the design and operation of electronic circuits and systems, particularly receivers used in communications systems. Conventionally, Class A amplifiers are used in communication receivers. Class A amplifiers use a single conductivity type transistor. In order to provide a signal current to a load, a large amount of direct (DC) current is required. This is due to the fact that in Class A amplifiers, the maximum load signal current is limited to the DC bias current. In push-pull operation, the load signal current is limited to twice the DC bias current. This is effectively the result of symmetric operation of two Class A stages in parallel. The load signal current is supplied by equal and opposite signal currents from the two Class A amplifiers in a push-pull action. Thus, the DC bias current for the push-pull amplifier can be one-half the DC bias current of the Class A amplifier to produce the same load signal current. As an example of this, if the load signal current is +I, this is generated by having the signal current of the upper class A PNP amplifier increase by +i/2, and the signal current of the lower Class A NPN amplifier decrease by +i/2, thereby creating the push-pull action.

Unfortunately, Class A amplifiers consume a considerable amount of power to achieve current performance requirements for noise and third order intercept (distortion intermodulation products).

Hence, a need remains in the art for an improved amplifier design offering lower power consumption operating at intermediate (IF) frequencies from baseband to 150 megahertz.

SUMMARY OF THE INVENTION

The present invention uses Class AB (push-pull) amplifiers, one in a higher voltage configuration and one in a lower voltage configuration, to achieve a high intercept at low power as well as a low noise figure. This complementary technology allows for higher performance at lower power.

In the illustrative embodiment, the invention includes a first circuit for receiving an input signal; a second circuit for shifting a level of the input signal; and a third circuit for amplifying the input signal. In the illustrative embodiment, the third circuit includes first and second transistors Q3 and Q4 connected in a push-pull configuration. The first transistor Q3 is of a first type and the second transistor Q4 is of a second type. In the specific illustrative embodiment, the first and second transistors Q3 and Q4 are connected to form a Class AB push-pull amplifier.

The teachings of the present invention are illustrated in a differential amplifier having first and second symmetrical circuits. The first circuit includes a first terminal for receiving a first differential input signal; an arrangement for shifting a level of the first differential input signal; and a circuit for amplifying the first differential input signal. The amplifying circuit including first and second transistors Q3 and Q4 connected in a push-pull configuration. The second circuit includes a second terminal for receiving a second differential input signal; an arrangement for shifting a level of the second differential input signal; and a circuit for amplifying the second differential input signal. The circuit for amplifying the second differential input signal includes third and fourth transistors Q6 and Q5 connected in a push-pull configuration. An arrangement is included for coupling the first and second circuits.

In the illustrative embodiment the first and second transistors Q3 and Q4 are connected as class A amplifiers in a push-pull configuration to form a Class AB amplifier. Likewise, the third and fourth transistors Q6 and Q5 are connected as Class A amplifiers in a push-pull configuration to form a Class AB amplifier. In this embodiment, the first and third transistors Q3 and Q6 are connected as Class A amplifiers and the second and fourth transistors Q4 and Q5 are connected as Class A amplifiers. However, in an alternative embodiment, the first and third transistors Q3 and Q6 are connected as Class AB amplifiers and the second and fourth transistors Q4 and Q5 are connected as Class AB amplifiers.

The present invention provides good IP3 (third order intermodulation product) performance, low noise figure and low power consumption with an ideal (e.g. 50 ohm) characteristic impedance. These advantages are afforded by the fact that truly complementary NPN and PNP devices are used. As a result, the Class AB action of a push-pull architecture can be extended to frequency ranges beyond what has been achievable up to this point in time. This allows for numerous applications to be addressed as well as higher frequency ranges.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
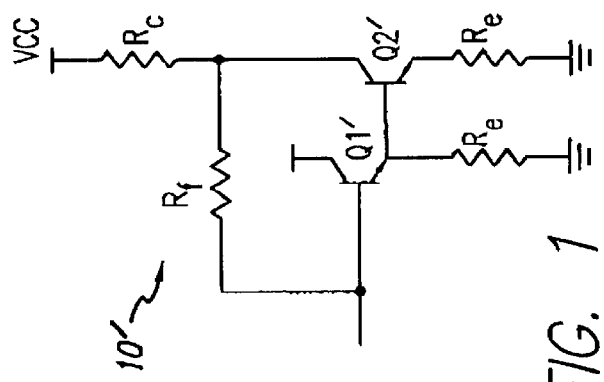
FIG. 1 is a simplified schematic diagram of a typically Class A amplifier such as that currently used in IF amplifiers of conventional design and construction.

FIG. 1 is a simplified schematic diagram of a typically Class A amplifier such as that currently used in IF amplifiers of conventional design and construction. The amplifier 10' includes first and second NPN type transistors Q1' and Q2' connected in cascade. Each transistor has an emitter resistor $R_e$. The first transistor Q1' is connected to a source of supply voltage $V_{cc}$. The second transistor Q2' is connected to the supply $V_{cc}$ via a collector resistor $R_c$ at a node to which a feedback resistor $R_F$ is connected. The feedback resistor $R_F$ thereby connects the collector of the second transistor Q2' to the base of the first transistor Q1'.

The Class A type amplifier 10' of FIG. 1 is typically a 50-ohm matched amplifier, which dissipates considerable power to achieve a high third order intercept. When implemented in single-ended to differential converters, the Class A architecture tends to offer high third order intercept performance at the expense of high power and high noise figure.

Figure 2:
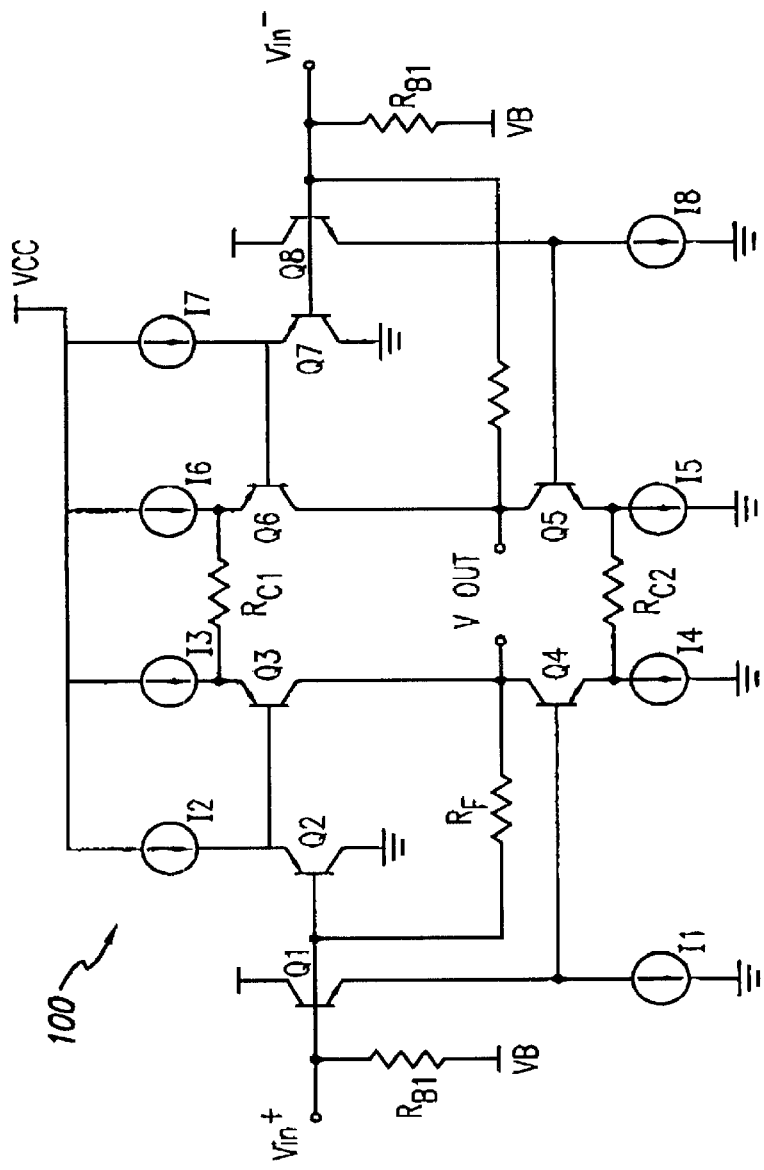
FIG. 2 is a simplified schematic diagram of single-to-differential or differential-to-differential converter circuit implemented with Class A(B) amplifiers in a push-pull class AB) configuration.

FIG. 2 is a simplified schematic diagram of single-to-differential or differential-to-differential converter circuit implemented with Class A amplifiers in a push-pull configuration to form Class AB operation in accordance with the teachings of the present invention. The system 100 includes an NPN transistor Q1 and a PNP transistor Q2 arranged in an emitter follower configuration with respect to a first input terminal $V_{in}^+$. That is, the base of Q1 is connected to the base of Q2. The collector of the first transistor Q1 is connected to a source of supply voltage $V_{cc}$. In the illustrative embodiment, $V_{cc}$ is 5 volts.

The emitter of Q1 is connected to ground through a first current source I1. A biasing resistor $R_{B1}$ is connected between the base of transistor Q1 and a source of base voltage $V_B$. The voltage $V_B$ sets the common mode DC level for the circuit 100. A feedback resistor $R_F$ is connected between the base of transistor Q2 and an output terminal. The feedback resistor $R_F$ sets the input impedance $Z_{in}$ and the output impedance $Z_{out}$ to be a match at a desired impedance (e.g., 50 ohms). The emitter of Q2 is connected to the source of supply $V_{cc}$ via a second current source I2. The collector of Q2 is connected to ground.

As shown in FIG. 2, the emitters of Q2 and Q1 are connected to the base terminals of third and fourth transistors Q3 and Q4 respectively and provide level shifting therefor. In the illustrative embodiment, the emitter of Q3 is connected to $V_{cc}$ via a third current source I3. Similarly, the emitter of Q4 is connected to ground via a fourth current source I4.

The circuit 100 is fully symmetrically balanced. That is, the second half of the circuit 100 is a mirror image of the first half and connected thereto by first and second emitter resistors $R_{e1}$ and $R_{e2}$ connected between Q3 and Q6, and Q4 and Q5, respectively. Those skilled in the art will recognize that each half of the circuit is novel in design and that the symmetrical configuration allows for a novel differential amplifier design.

The second half of the circuit 100 includes transistors Q5 and Q6 connected in a push-pull configuration with Q5 being NPN and Q6 being PNP. Transistors Q7 and Q8 are connected in an emitter follower configuration to provide level shifting as per Q1 and Q2. The second input terminal $V_{in}^-$ may be terminated in a matched impedance (e.g., 50 ohms) and the circuit 100 will operate as a single to differential converter. As an alternative, second input terminal $V_{in}^-$ may be driven differentially and the circuit 100 will operate as a differential-to-differential driver amplifier.

For a $_{single}$-ended input, the other input can either be left floating or have an AC-coupled 50 Ω impedance to ground. The $R_e$ in the PNP and NPN differential pairs allow the single-ended to differential action to occur when the amplifier is driven in a single-ended mode. The gain of the circuit is set in accordance with the following relation taking into account a distortion specification as follows. Using a linear, large signal model, or a hybrid-pi small signal model, the voltage gain for the class A amplifier in FIG. 1, and the push-pull amplifier in FIG. 2 can be determined. The voltage gain for the class A amplifier in FIG. 1 is determined to be:

$$v_{OUT}/v_{IN} = R_L/R_E \quad [1]$$

where $R_L$ is the resistive load at the output, and $R_E$ is the resistive degeneration for the transistor. Similarly, the voltage gain for the push-pull amplifier in FIG. 2 is:

$$v_{OUT}/v_{IN} = 2(R_L/R_E) \quad [2]$$

where $R_L$ is the resistive load at the output, and $R_E$ is the resistive degeneration for the class A differential amplifier. The gain factor of two comes from the fact the amplifier in FIG. 2 provides push-pull signal current action, symmetrically, from the top and bottom differential amplifiers. This creates twice the signal current of the single class A amplifier. Those skilled in the art can derive the above gain expressions in a straightforward manner.

As is evident from the above, $R_{e1,2}$ and $R_F$ may be set by one of ordinary skill in the art to set the gain and distortion of the circuit 100 and the input and output impedance match. $R_{B1}$ is high valued resistor that goes to a bias voltage required to bias the inputs. The value of $R_{B1}$ is chosen to be much much greater than the input impedance of the circuit 100 and will be of a value chosen in relation to the voltage $V_B$.

Note that Q3 and Q6 are a Class A differential pair and Q4 and Q5 are a Class A differential pair. The current sources I1, I2, I7 and I8 are emitter follower current sources chosen to be large enough to drive the Class A differential pairs. The current sources I3, I4, I5, and I6 are dependent on the noise and distortion performance characteristics required for a given application. One of ordinary skill in the art would be able to set the size of the current sources to meet the requirements of a given application.

In the illustrative embodiment, the amplifier circuit 100 is designed for a 50-ohm system. Thus, the differential input and output impedance is 100 ohms (differential). This allows direct connection to standard 50 ohm interfaces and does not require impedance transformations at the input and output interfaces as is the case for the certain devices currently sold for this application.

The present invention provides good IP3 (third order intermodulation product) performance, low noise figure and low power consumption with an ideal 50-ohm impedance. It should also be noted that other amplifiers use a higher impedance interface (100–200 Ω). This is done in order to achieve good distortion performance at low power. The architecture of the present invention achieves low power and good distortion performance while using a lower (standard) 50 Ω interface. These advantages are afforded by the fact that the NPN and PNP devices are truly complementary devices. As a result, the Class AB action of a push-pull architecture can be extended to frequency ranges beyond what has been achievable up to this point in time. This allows for numerous applications to be addressed as well as higher frequency ranges.

As will be apparent to those skilled in the art, Q3 and Q4 are arranged in a push-pull configuration and therefore comprise a Class AB amplifier. That is, the first input terminal $V_{in}^+$ goes high, the current in Q4 increases and the current in Q3 decreases. If Q3 and Q4 were equally matched devices in size and performance characteristics, (the current therethrough would be exactly half of the total in each transistor). The contribution of signal current from transistors Q3 and Q4 to the load resistor is equal amplitude, and opposite polarity. This defines the push-pull action. For example, when the output voltage goes high, the total current in transistor Q3 increases by ½ the output signal current, and the total current in transistor Q4 decreases by ½ the output signal current. In this fashion, Q3 and Q4 have signal current terms that are equal in amplitude, and opposite in phase. These equal and opposite signal currents combine constructively to produce the output signal current.

Hence, to achieve an output current of ΔI, only half of a standing current of ΔI is required to produce the desired signal current ΔI. For the class A amplifier in FIG. 1, the maximum signal current is equal to the DC, quiescent (or standing) current in the amplifier, i.e., $$\Delta I(\max) = I_{DC} \quad [3]$$

For the push-pull amplifier in FIG. 2, due to the class AB action, the maximum signal current is:

$$[\Delta I(\max)/2] = I_{DC} \quad [4]$$

or $$\Delta I(\max) = 2I_{DC} \quad [5]$$

If the output signal current for the class A and push-pull amplifiers in FIGS. 1 and 2 are equal, from above it can be seen that:

$$I_{DC}(\text{class A}) = 2I_{DC}(\text{push-pull}) \quad [6]$$

to achieve the same maximum output signal current. Those skilled in the art can derive the above expressions in a straightforward manner.

In a Class A configuration, twice as much standing current would be required (i.e., 2×ΔI/2=ΔI) would be required in order to avoid a shutoff of the transistor. This accounts for the advantageous power savings associated with the present invention. As mentioned above, Q3 and Q6 are a Class A differential pair and Q4 and Q5 are a Class A differential pair. Nonetheless, the more significant relationship is that of Q3 to Q4 and of Q6 to Q5. Each of these pairs are arranged in a Class AB configuration. If more headroom can be accommodated with respect to the power supply $V_{cc}$, then the differential pairs can also be turned into Class AB operation. This is depicted in FIG. 3 below.

Figure 3:
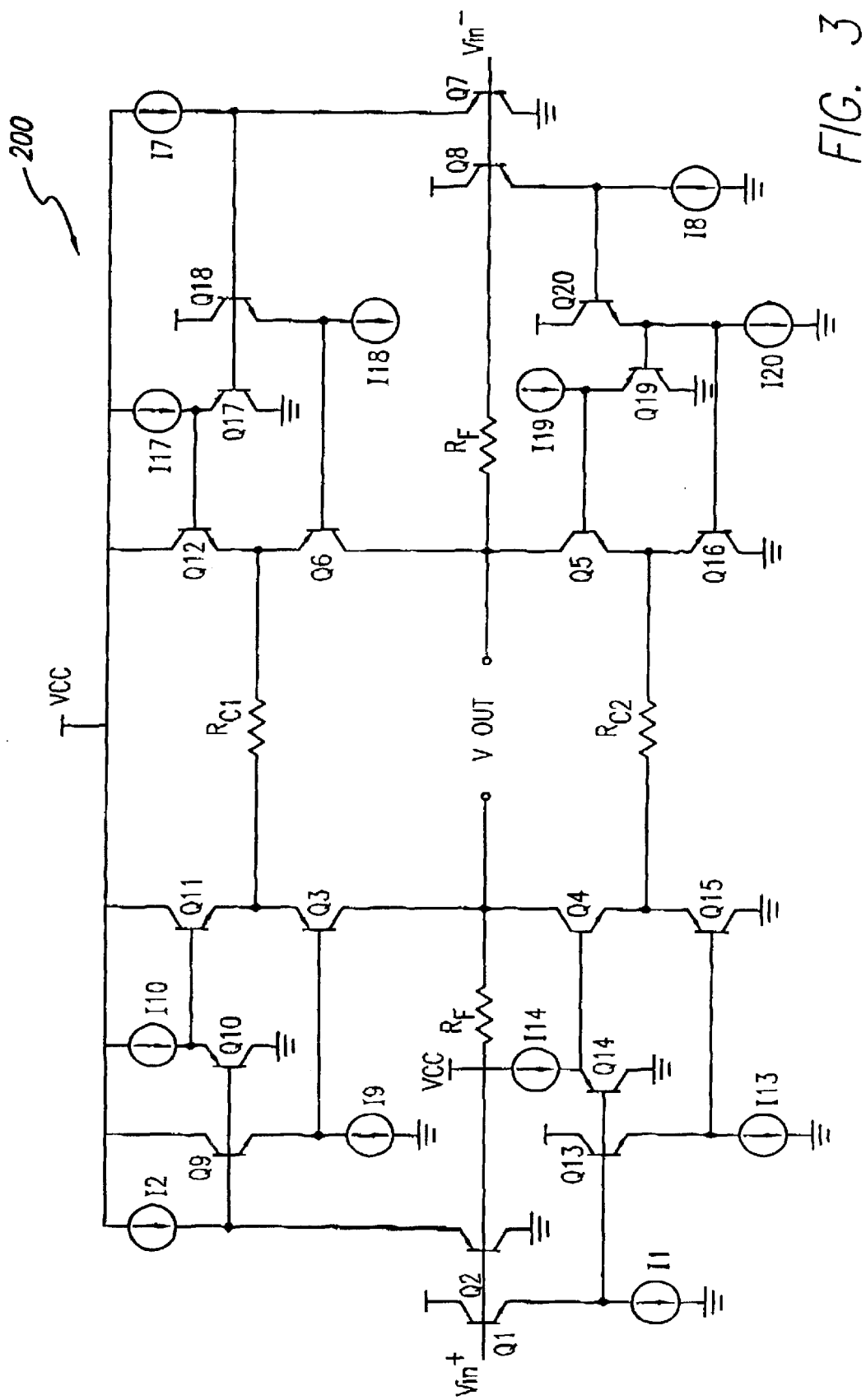
FIG. 3 is a simplified schematic diagram of an alternative embodiment of a single-to-differential or differential-to-differential converter circuit implemented with Class AB amplifiers in accordance with the teachings of the present invention.

FIG. 3 is a simplified schematic diagram of an alternative embodiment of a single-to-differential or differential-to-differential converter circuit implemented with Class AB amplifiers in accordance with the teachings of the present invention. The amplifier 200 of FIG. 3 is similar to the amplifier 100 of FIG. 2 with two exceptions:

1) The addition of level shifting transistors Q9, Q10, Q13, Q14, Q17, Q18, Q19 and Q20 and associated current sources I9, I10, I13, I14, I17, I18, I19 and I20, respectively.

2) The current sources I3, I6, I4 and I5 are replaced with push pull transistors Q11, Q12, Q15 and Q16, respectively. Hence, instead of using Class A differential pairs Q3, Q6 and Q4, Q5, Class AB operation is effected within the push-pull configuration. That is, the use of current sources in FIG. 2 caused Q3, Q6 and Q4 and Q5 to be Class A devices as the current sources limit the amount of signal current that may be conducted through the transistors and $R_{e1,2}$ to the DC current. While in FIG. 3, the use of transistors Q11, Q12, Q15 and Q16 will cause Q3, Q6 and Q4 and Q5 to be Class AB devices as the current limiting sources are removed and the signal current that may be conducted through the transistors and $R_{e1,2}$ will be limited to twice the DC current as the devices are symmetric.

At the emitter of a class AB stage, the signal current that may be conducted through the through the degeneration resistors $R_{e1,2}$ is $\Delta I_E$. The maximum signal current related to the DC (or quiescent or standing) current in the transistors is:

$$[\Delta I_E(\max)/2] = I_{DC} \quad [7]$$

or $$\Delta I_E(\max) = 2I_{DC} \quad [8]$$

This is a result of the class AB action of the complementary, symmetric transistors. Thus, the signal current in the degeneration resistance in the class AB stage in FIG. 3 has the same relationship to the DC (or quiescent or standing) current that the output signal current does for the push-pull amplifier in FIG. 2. The signal current in the degeneration resistor can be twice the DC bias current. This results in a further power savings over the design of FIG. 2 useful in those applications where a higher supply voltage rail is available. The power savings results from the fact that the Class AB differential pairs Q3–Q11, Q6–Q12 and Q4–Q15, Q5–Q16 of FIG. 3 have a lower standing current requirement than the Class A type differential pairs Q3, Q6 and Q4, Q5 of FIG. 2.

The maximum available signal current in the degeneration resistor for FIG. 2 is limited to:

$$\Delta I_E(\max) = I_{DC} \quad [9]$$

For the class AB amplifier in FIG. 3, as stated previously, the maximum available signal current in the degeneration resistor is:

$$\Delta I_E(\max) = 2I_{DC} \quad [10]$$

Thus, at the resistive degeneration, the class AB amplifier of FIG. 3 has an advantage over the push-pull amplifier in FIG. 2 because the signal current in the degeneration resistor is not limited to the DC bias current. This is a result of the class AB action of the circuit, and exemplifies the advantage of class AB over class A.

In FIG. 3, Q1, Q2, Q9, Q10, Q13 and Q14 on one side, and Q7, Q8, Q17, Q18, Q19, and Q20 on the other side, provide DC level shifting to the Class AB amplifiers Q11–Q12, Q3–Q6, Q4–Q5, and Q15–Q16 as per the emitter follower circuits of FIG. 2. In FIG. 3, the current sources I1, I2, I7,I8, I9,I10,I13,I14, I17,I18,I19 and I20 may be active or resistive depending on any voltage supply limitation considerations required for a given application.

Thus, the present invention has been described herein with reference to a particular embodiment for a particular application. Those having ordinary skill in the art and access to the present teachings will recognize additional modifications, applications and embodiments within the scope thereof. For example, those skilled in the art will appreciate that for the circuits shown in FIG. 2 and FIG. 3, (the NPN and the PNP transistors may be interchanged CMOS or enhancement/depletion MESFET devices without departing from the scope of the present teachings. Further, the present invention is not limited to an implementation in bipolar technology. The present invention may be implemented in other transistor technologies without departing from the scope of the present teachings.

It is therefore intended by the appended claims to cover any and all such applications, modifications and embodiments within the scope of the present invention.

Accordingly,

What is claimed is:

1. An amplifier comprising:

first means for receiving an input signal;

second means for shifting a level of said input signal; and third means for amplifying said input signal, said third means including first and second transistors Q3 and Q4 connected in a push-pull configuration, wherein said first transistor Q3 is of a first type and said second transistor Q4 is of a second type and said first and second transistors Q3 and Q4 being connected whereby an output terminal of said first transistor Q3 is connected to an output terminal of said amplifier and an output terminal of said second transistor Q4 is connected to an output terminal of said amplifier;

wherein said second means includes a third transistor Q1 of said second type and a fourth transistor Q2 of said first type, and wherein an output terminal of said third transistor Q1 is connected to ground via a first current source, and further wherein the output terminal of said third transistor Q1 is connected to an input terminal of said second transistor Q4.

2. The invention of claim 1 wherein said first and second transistors Q3 and Q4 are connected as Class AB amplifiers.

3. The invention of claim 1 wherein an input terminal of said third transistor Q1 is connected to said output terminal of said amplifier via a resistor $R_F$.

4. The invention of claim 3 wherein said input terminal of said third transistor Q1 is connected to an input terminal of said fourth transistor Q2.

5. The invention of claim 4 wherein an output terminal of said fourth transistor Q2 is connected to an input terminal of said first transistor Q3.

6. The invention of claim 5 wherein said output terminal of said fourth transistor Q2 is connected to a source of supply voltage $V_{cc}$ by a second current source I2.

7. The invention of claim 6 wherein a terminal of said first transistor Q3 is connected to said source $V_{cc}$ by a third current source I3.

8. The invention of claim 7 wherein a terminal of said second transistor Q4 is connected to ground via a fourth current source I4.

9. The invention of claim 1 wherienf said first type is PNP and said second type is NPN.

10. The invention of claim 1 wherein said first type is NPN and said second type is PNP.

* * * * *

UNITED STATES PATENT AND TRADEMARK OFFICE
CERTIFICATE OF CORRECTION

PATENT NO. : 6,535,062 B1
DATED : March 18, 2003
INVENTOR(S) : Lloyd F. Linder and Thomas E. Frost It is certified that error appears in the above-identified patent and that said Letters Patent is hereby corrected as shown below:

Title page,
Item [73], Assignee, should read -- TelASIC Communications, Inc., El Segundo, CA (US) --.

Signed and Sealed this

Twenty-first Day of October, 2003

JAMES E. ROGAN
*Director of the United States Patent and Trademark Office*